United States Patent
Lin et al.

(10) Patent No.: US 9,570,578 B2
(45) Date of Patent: Feb. 14, 2017

(54) GATE AND GATE FORMING PROCESS

(71) Applicant: UNITED MICROELECTRONICS CORP., Hsin-Chu (TW)

(72) Inventors: Keng-Jen Lin, Kaohsiung (TW); Chien-Liang Lin, Taoyuan (TW); Yu-Ren Wang, Tainan (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/619,085

(22) Filed: Feb. 11, 2015

(65) Prior Publication Data

US 2016/0233092 A1 Aug. 11, 2016

(51) Int. Cl.
*H01L 29/66* (2006.01)
*H01L 21/285* (2006.01)
*H01L 21/28* (2006.01)
*H01L 29/49* (2006.01)
H01L 21/322 (2006.01)
H01L 29/51 (2006.01)

(52) U.S. Cl.
CPC ... *H01L 29/66545* (2013.01); *H01L 21/28088* (2013.01); *H01L 21/28506* (2013.01); *H01L 29/4966* (2013.01); H01L 21/3221 (2013.01); H01L 29/517 (2013.01)

(58) Field of Classification Search
None
See application file for complete search history.

(56) References Cited

U.S. PATENT DOCUMENTS

| | | | | |
|---|---|---|---|---|
| 4,996,576 A | * | 2/1991 | Lynch | H01L 31/119 250/370.07 |
| 6,902,977 B1 | * | 6/2005 | Kluth | H01L 21/28035 257/E21.197 |
| 8,211,775 B1 | * | 7/2012 | Ma | H01L 29/4983 257/E21.444 |
| 8,450,191 B2 | * | 5/2013 | Wang | H01L 21/02529 257/E21.09 |
| 9,305,923 B1 | * | 4/2016 | Ok | H01L 27/0924 |
| 9,418,853 B1 | * | 8/2016 | Wang | H01L 21/28185 |
| 2003/0057432 A1 | * | 3/2003 | Gardner | H01L 21/28185 257/100 |
| 2008/0176375 A1 | * | 7/2008 | Erben | C23C 16/0272 438/386 |
| 2010/0127336 A1 | * | 5/2010 | Chambers | H01L 21/28088 257/369 |
| 2012/0244657 A1 | * | 9/2012 | Iijima | H01L 27/14627 438/70 |
| 2012/0280288 A1 | * | 11/2012 | Ando | H01L 21/28176 257/288 |
| 2013/0093064 A1 | * | 4/2013 | Lin | H01L 21/28185 257/637 |
| 2013/0178021 A1 | * | 7/2013 | Cheng | H01L 27/0629 438/155 |
| 2013/0240990 A1 | * | 9/2013 | Yin | H01L 29/456 257/343 |

\* cited by examiner

*Primary Examiner* — Andres Munoz
(74) *Attorney, Agent, or Firm* — Winston Hsu; Scott Margo

(57) ABSTRACT

A gate forming process includes the following steps. A gate dielectric layer is formed on a substrate. A barrier layer is formed on the gate dielectric layer. A silicon seed layer and a silicon layer are sequentially and directly formed on the barrier layer, wherein the silicon seed layer and the silicon layer are formed by different precursors.

12 Claims, 5 Drawing Sheets

GATE AND GATE FORMING PROCESS

BACKGROUND OF THE INVENTION

1. Field of the Invention

The present invention relates generally to a gate and a gate forming process, and more specifically to a gate and a gate forming process relating to a silicon layer on a barrier layer.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

Poly-silicon is conventionally used as a gate electrode in semiconductor devices, such as multi-gate MOSFET devices. With the trend towards scaling down the size of semiconductor devices, however, conventional poly-silicon gates face problems such as inferior performance due to boron penetration and unavoidable depletion effect. This increases the equivalent thickness of the gate dielectric layer, reduces gate capacitance, and worsens a driving force of the devices. Therefore, work function metals that are suitable for use as a high-K gate dielectric layer are used to replace the conventional poly-silicon gate as the control electrode.

Multilayers on the high-K gate dielectric layer, such as work function metals or barrier layers between the work function metals and the high-K gate dielectric layer, will have ingredients diffusing toward the high-K gate dielectric layer which degrade the high-K gate dielectric layer. As the size of semiconductor devices is scaled down, these problems may decrease processing yields or even make a formed device unable to approach the electrical requirements.

SUMMARY OF THE INVENTION

The present invention provides a gate and a gate forming process, which forms silicon layers on a barrier layer to decrease oxygen atoms in the barrier layer diffusing to a gate dielectric layer.

The present invention provides a gate forming process including the following steps. A gate dielectric layer is formed on a substrate. A barrier layer is formed on the gate dielectric layer. A silicon seed layer and a silicon layer are sequentially and directly formed on the barrier layer, wherein the silicon seed layer and the silicon layer are formed by different precursors.

According to the above, the present invention provides a gate and a gate forming process, which sequentially stacks at least one silicon seed layer and at least one silicon layer directly on a barrier layer to trap oxygen atoms in the barrier layer at an interface of the silicon seed layer and the silicon layer. It is noted that the silicon seed layer and the silicon layer must be formed by different precursors to form the interface. Therefore, dangling bonds can be formed at the interface to trap oxygen atoms from the barrier layer. As more oxygen atoms are trapped by the silicon seed layer and the silicon layer, less oxygen atoms will diffuse toward a gate dielectric layer below the barrier layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
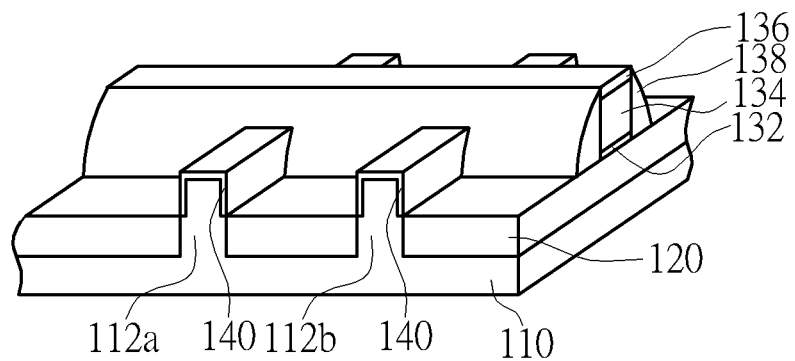
FIGS. 1-2 schematically depict 3-dimensional diagrams of a gate forming process according to one embodiment of the present invention.
Figure 2:
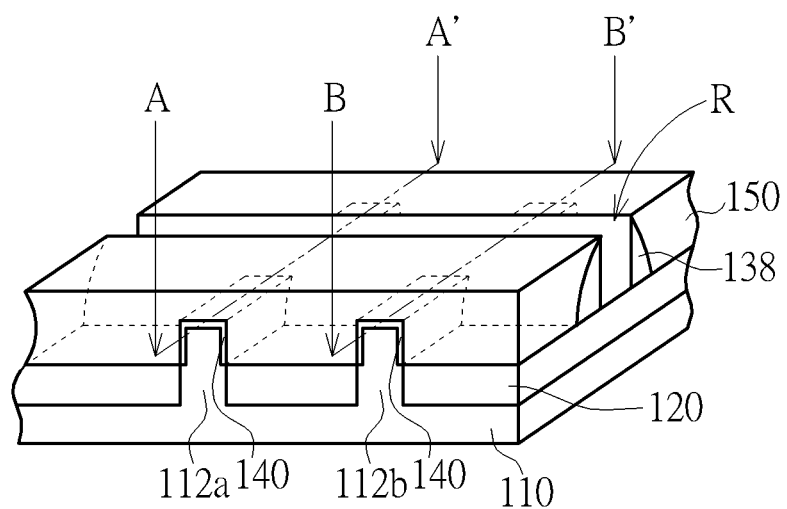

FIG. 1-2 schematically depict 3-dimensional diagrams of a gate forming process according to one embodiment of the present invention. As shown in FIG. 1, a substrate 110 is provided. Two fin-shaped structures 112a/112b are formed on the substrate 110. More precisely, the method of forming the fin-shaped structures 112a/112b may include the following steps. A bulk substrate (not shown) is provided. A hard mask (not shown) is formed thereon. The hard mask (not shown) is patterned to define the locations of the fin-shaped structures 112a/112b in the substrate 110. An etching process is performed on the bulk substrate (not shown) so that the fin-shaped structures 112a/112b are formed. The fabrication of the fin-shaped structures 112a/112b on the substrate 110 is then finished. Two fin-shaped structures 112a/112b are depicted in this embodiment, but the present invention can also be applied to other numbers of fin-shaped structures 112a/112b.

An isolation structure 120 is formed on the substrate 110 between the fin-shaped structures 112a/112b. The isolation structure 120 may be a shallow trench isolation (STI) structure, which may be formed by a shallow trench isolation (STI) process, but is not limited thereto. In one embodiment, the hard mask (not shown) is removed after the fin-shaped structures 112a/112b are formed, and a tri-gate MOSFET can be formed in the following processes. There are three contact faces between each of the fin-shaped structures 112a/112b and the later formed dielectric layer, and are used as a carrier channel whose width is wider than a channel width of a conventional planar MOSFET. When a driving voltage is applied, the tri-gate MOSFET produces an on-current two times higher compared to the conventional planar MOSFET. In another embodiment, the hard mask layer (not shown) is reserved to form another kind of multi-gate MOSFET. Due to the hard mask layer (not shown) being reserved, there are only two contact faces between each of the fin-shaped structures 112a/112b and a later formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched until an oxide layer being a middle part of the silicon-on-insulator substrate (not shown) is exposed, meaning that the fin-shaped structure formed on the silicon-on-insulator substrate (not shown) is finished.

After the fin-shaped structures 112a/112b are formed, a dielectric layer (not shown), an electrode layer (not shown) and a cap layer (not shown) are formed across the fin-shaped structures 112a/112b and then three of them are patterned to form a dielectric layer 132, an electrode layer 134 and a cap layer 136. A spacer 138 is formed beside the dielectric layer 132, the electrode layer 134 and the cap layer 136. A source/drain region 140 may be respectively formed on each of the fin-shaped structures 112a/112b beside the spacer 138 by methods such as an inclination ion implantation process. A lightly source/drain region (not shown) or/and an epitaxial structure (not shown) may also be respectively formed on each of the fin-shaped structures 112a/112b beside the spacer 138 before/after the source/drain region 140 is formed.

In this embodiment, a gate forming process of the present invention is applied to a gate-last for high-k last process. Therefore, the dielectric layer 132 may be an oxide layer; the electrode layer 134 is a polysilicon layer but they will be replaced by metal layers in subsequent processes; the cap layer 136 and the spacer 138 may be single layer or multilayer composed of nitride layers or oxide layers, but they are not limited thereto. In a modification, the present invention can also be applied to a gate-last for high-k first process or a gate-first process etc., and the dielectric layer 132 and the electrode layer 134 are therefore formed with suitable dielectric materials or metal materials.

Thereafter, an interdielectric layer (not shown) is formed and covers the substrate 110, the fin-shaped structures 112a/112b, the spacer 138 and the cap layer 136. Then, the interdielectric layer (not shown) is planarized to form an interdielectric layer 150. The planarization process may include a chemical mechanical polishing (CMP) process or an etching process, but is not limited thereto. As the planarization process is performed, the cap layer 136 is also removed to expose the electrode layer 134. Then, the electrode layer 134 is removed and a recess R is thereby formed, as shown in FIG. 2. In following processes, metal materials will be filled into the recess R on each of the fin-shaped structures 112a/112b to form a multi-gate MOSFET. The fin-shaped structures 112a/112b include common metal layers in this embodiment, but they may include different metal layers in other embodiments. For clarifying the present invention, FIGS. 3-9 schematically depict cross-sectional views of a gate forming process along AA' sectional line of FIG. 2. A gate forming process along BB' sectional line of FIG. 2 is similar to that along AA' sectional line of FIG. 2, and thus is not depicted again.

Figure 3:
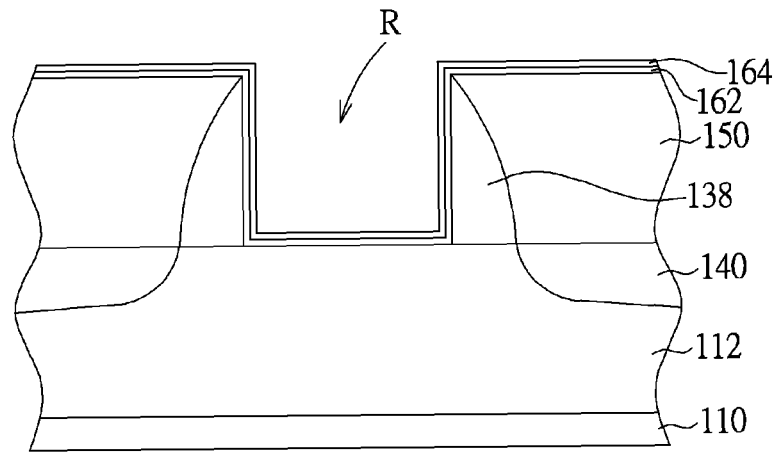
FIGS. 3-9 schematically depict cross-sectional views of a gate forming process alone AA' sectional line of FIG. 2.

As shown in FIG. 3, the spacer 138 and the interdielectric layer 150 are respectively formed across the fin-shaped structure 112a. The source/drain region 140 is formed in the fin-shaped structure 112a beside the spacer 138. The spacer 138 surrounds a recess R, which exposes parts of the fin-shaped structure 112a. Then, a buffer layer 162 may be optionally formed on the fin-shaped structure 112a and then a gate dielectric layer 164 may be formed on the fin-shaped structure 112a. The buffer layer 162 may be an oxide layer, and the gate dielectric layer 164 may be a dielectric layer having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but is not limited thereto.

Figure 4:
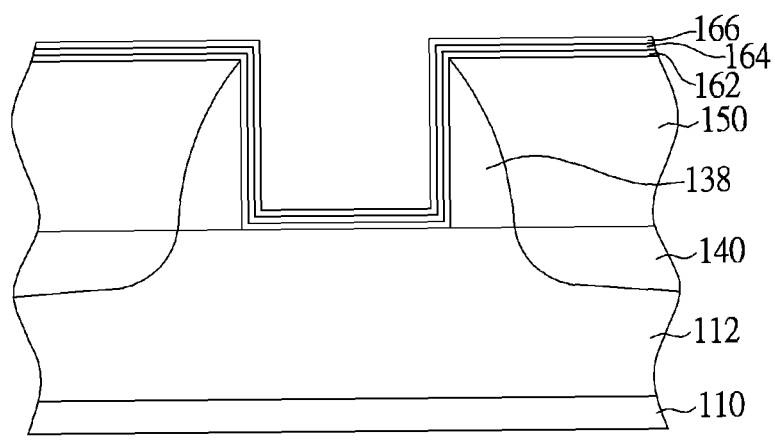

As shown in FIG. 4, a barrier layer 166 is formed on the gate dielectric layer 164, wherein the barrier layer 166 may be a titanium nitride layer or a tantalum nitride layer, but is not limited thereto. In this embodiment, the barrier layer 166 is a bottom barrier layer, and the barrier layer 166 is a titanium nitride layer.

Figure 5:
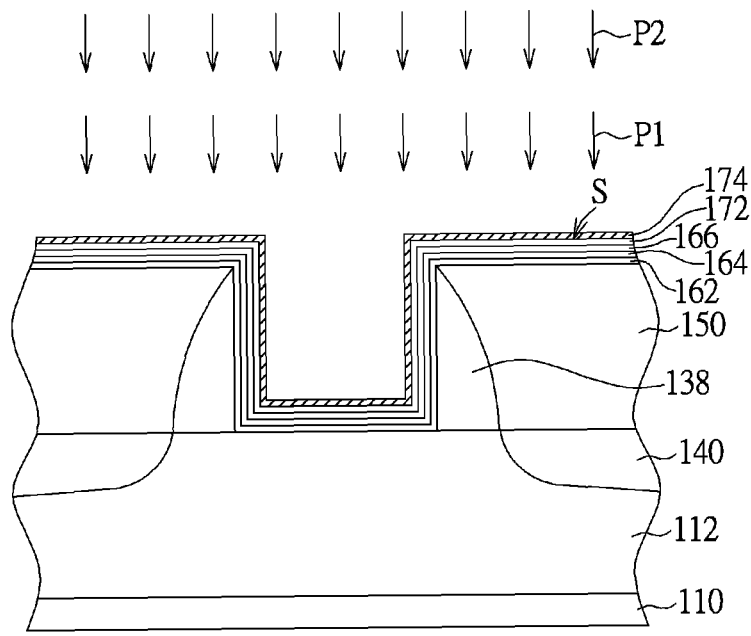

As shown in FIG. 5, a silicon seed layer 172 and a silicon layer 174 are sequentially formed on the barrier layer 166. In this embodiment, the silicon seed layer 172 and the silicon layer 174 are directly formed on the barrier layer 166 to absorb oxygen atoms in the barrier layer 166. It is emphasized that the silicon seed layer 172 and the silicon layer 174 are formed by different precursors to form an interface S between the silicon seed layer 172 and the silicon layer 174. The silicon seed layer 172 and the silicon layer 174 may all be formed by precursors including silane (which is used to form silicon containing layers), but there must be at least one different precursor to form different layers of the silicon seed layer and the silicon layer. As the silicon seed layer 172 and the silicon layer 174 are deposited, oxygen atoms in the barrier layer 166 not only move toward the gate dielectric layer 164 and the buffer layer 162 but also toward the silicon seed layer 172 and the silicon Layer 174, and especially become trapped at the interface S of the silicon seed layer 172 and the silicon layer 174. As more oxygen atoms are trapped by the silicon seed layer 172 and the silicon layer 174, less oxygen atoms will diffuse toward the gate dielectric layer 164 and the buffer layer 162. The silicon layer 174 is preferably an amorphous silicon layer to generate more dangling bonds and trap more oxygen atoms.

Preferably, the silicon seed layer 172 and the silicon layer 174 are formed in-situ to avoid pollution occurring after the silicon seed layer 172 is formed and before the silicon layer 174 is formed. More precisely, the silicon seed layer 172 and the silicon layer 174 are formed by a chemical vapor deposition process or an atomic layer deposition process, but this is not limited thereto. In one case, the silicon seed layer 172 and the silicon layer 174 are formed by a chemical vapor deposition process, wherein the processing temperature of the chemical vapor deposition process is preferably between 360° C.~420° C. Still preferably, the processing temperature of the chemical vapor deposition process is 380° C. As the processing temperature is lower than 360° C., the depositing of the silicon seed layer 172 and the silicon layer 174 is difficult; as the processing temperature is higher than 420° C., oxygen atoms in the barrier layer 166 would be induced downward to the gate dielectric layer 164 and the buffer layer 162. Thereby, an equivalent oxide thickness (EOT) of a formed device is better as the processing temperature of the chemical vapor deposition process is at a suitable processing temperature such as in a range of 360° C.~420° C.

Figure 6:
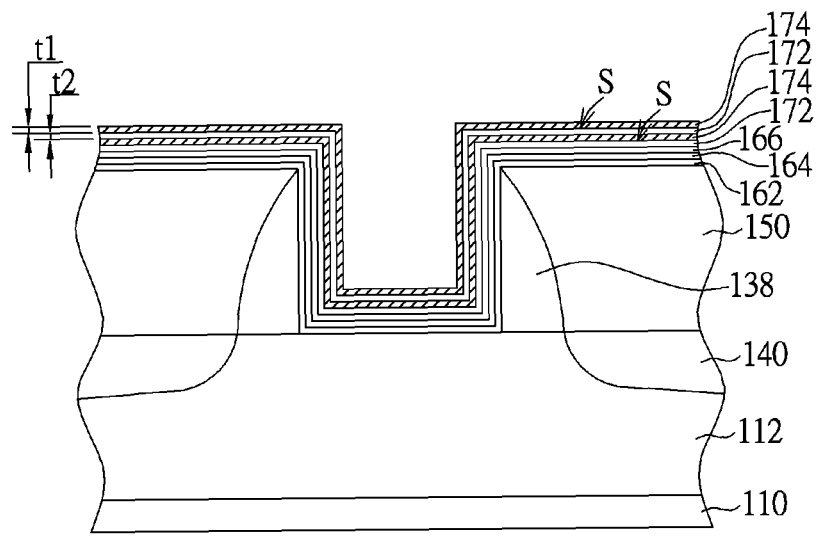

As shown in FIG. 6, the silicon seed layer 172 and the silicon layer 174 are formed repeatedly. Therefore, two interfaces S between the silicon seed layers 172 and the silicon layers 174 are formed which can trap more oxygen atoms in the barrier layer 166 than only one interface S of one silicon seed layer 172 and one silicon layer 174. The step of sequentially forming the silicon seed layer 172 and the silicon layer may be performed many times and a plurality of the silicon seed layers 172 and the silicon layers 174 can be stacked alternately, according to practical requirements. Since oxygen atoms are easier to diffuse toward a silicon surface and combine with silicon, the distribution of oxygen concentration approaches peak values at the interfaces S of the silicon seed layers 172 and the silicon layers 174. More interfaces S are formed, leading to more silicon dangling bonds being generated in the interfaces S. Hence, more oxygen atoms in the barrier layer 166 can move toward the interfaces S between the silicon seed layers 172 and the silicon layers 174 and be trapped in the interfaces S between the silicon seed layers 172 and the silicon layers 174. Less oxygen atoms will move toward the gate dielectric layer 164 thereby improving processing yields and reliability.

Multiple silicon seed layers 172 and silicon layers 174 can absorb oxygen atoms more effectively than one single silicon seed layer 172 and silicon layer 174. The efficiency of absorbing oxygen atoms can approach 21% when utilizing multiple silicon seed layers 172 and silicon layers 174 while the efficiency of absorbing oxygen atoms is only 7% when utilizing one single silicon seed layer 172 and silicon layer 174. Preferably, the step of sequentially forming the silicon seed layer 172 and the silicon layer 174 is performed 4 times. The thickness t1 of each of the silicon layers 174 is larger than the thickness t2 of each of the silicon seed layers 172. Preferably, the thickness ratio of the silicon layer 174 to the silicon seed layer 172 is 3~6. For instance, the thickness t1 of each of the silicon layers 174 may be 25 angstroms while the thickness t2 of each of the silicon seed layers 172 is 5 angstroms, and the silicon layers 174 and the silicon seed layers 172 may be alternately stacked twice to constitute a 60 angstrom stacked structure.

Figure 7:
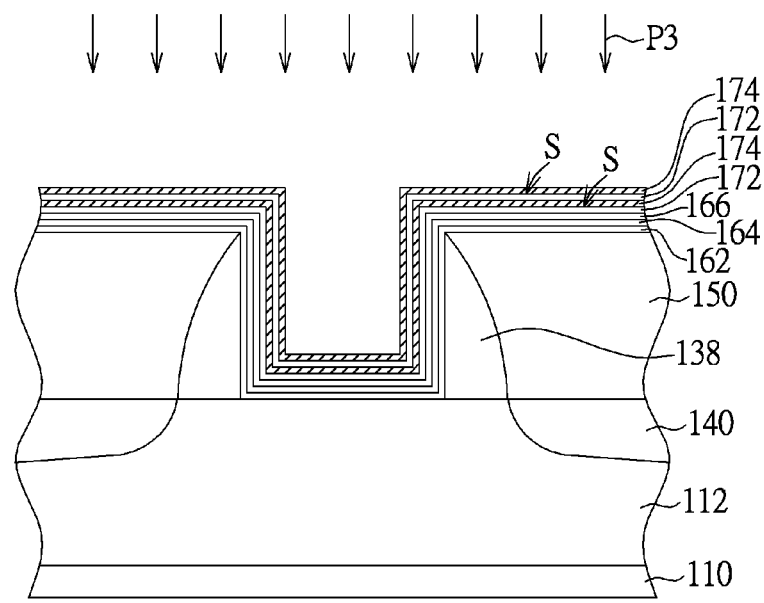

As shown in FIG. 7, an annealing process P3 may be performed after the silicon seed layers 172 and the silicon layers 174 are formed. As the annealing process P3 is performed, ingredients such as oxygen, titanium and nitrogen in the barrier layer 166 of this embodiment will react with silicon of the silicon seed layers 172 and the silicon layers 174. This means titanium silicon dioxide ($TiSiO_2$) and titanium oxynitride (TiON) may be composited in the silicon seed layers 172 and the silicon layers 174, but this is not limited thereto.

In this embodiment, one single annealing process P3 is performed immediately after all the silicon seed layers 172 and the silicon layers 174 are formed. In another embodiment, the annealing process P3 may be performed immediately after each of the silicon seed layers 172 and the silicon layers 174 are formed. In one case, the annealing process P3 is a rapid thermal processing (RTP) process, but is not limited thereto. Preferably, the annealing temperature of the annealing process P3 is between 900° C.~1200. Still preferably, the annealing temperature of the annealing process P3 is 970° C.

Figure 8:
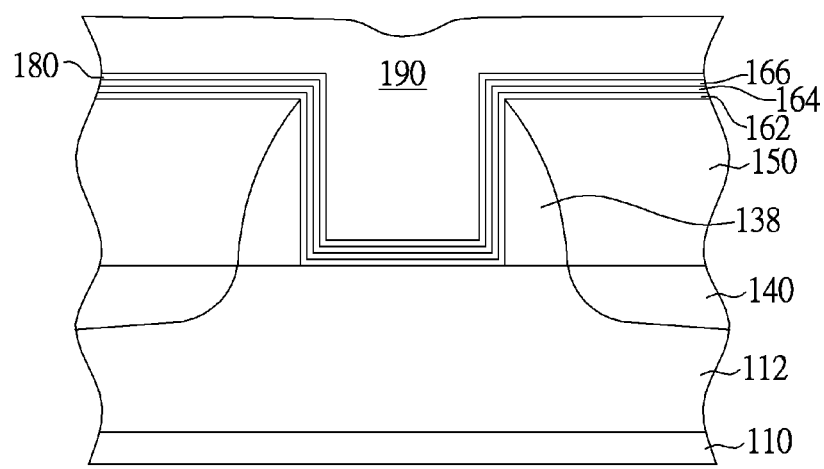

Thereafter, the silicon layers 174 and the silicon seed layers 172 are removed, as shown in FIG. 8. Then, a work function metal layer 180 may be formed on the barrier layer 166. A top barrier layer (not shown) may be formed after/before, or after and before the work function metal layer 180 is formed. The work function metal layer 180 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) etc. The top barrier layer may be a single layer or a multilayer structure composed of tantalum nitride (TaN) or titanium nitride (TiN). A low resistivity material 190 may cover the work function metal layer 180 and fill up the recess R (shown in FIG. 3). The low resistivity material 190 may be composed of low resistivity materials such as aluminum, tungsten, titanium aluminum (TiAl) alloy, or cobalt tungsten phosphide (CoWP).

Figure 9:
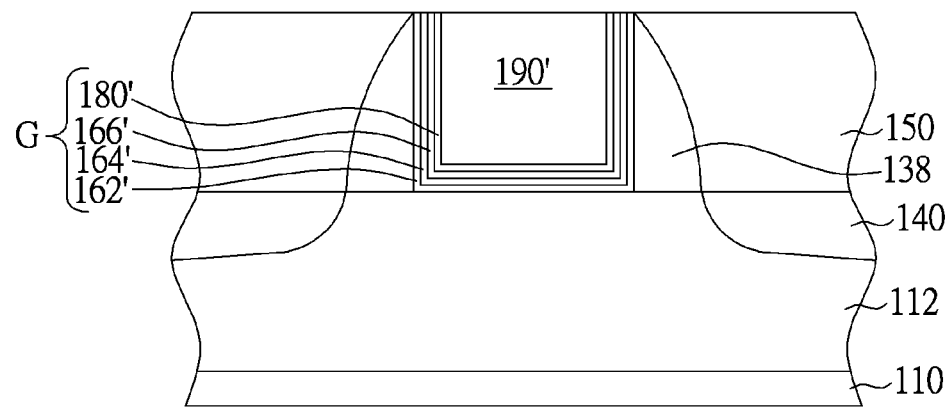

Thereafter, the low resistivity material 190, the work function metal layer 180, the barrier layer 166, the gate dielectric layer 164 and the buffer layer 162 may be patterned to form a metal gate G including a buffer layer 162', a gate dielectric layer 164', a barrier layer 166', a work function metal layer 180' and a low resistivity material 190', as shown in FIG. 9. Sequential semiconductor processes such as interconnects or other processes for forming the above layers may then be performed.

Figure 10:
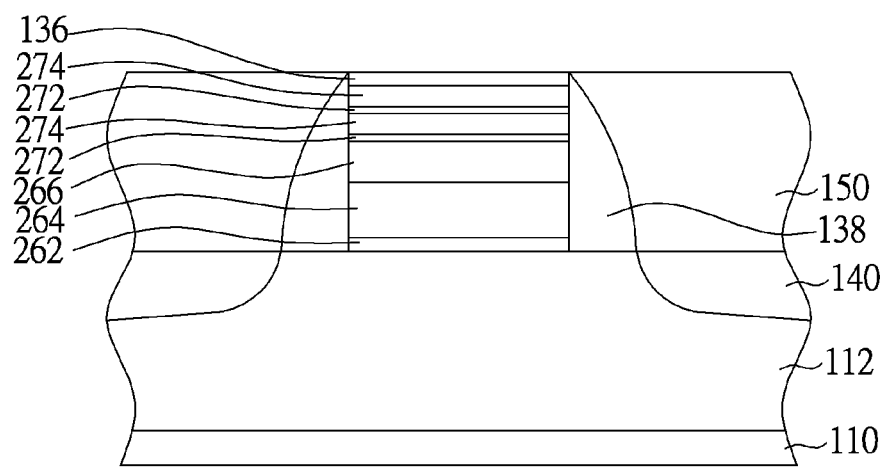
FIG. 10 schematically depicts a cross-sectional view of a gate forming process according to one embodiment of the present invention.

In another embodiment, the present invention can also be applied to a gate-last for high-k first process. Silicon seed layers and silicon layers of the present invention can be applied to form a dummy gate layer such as a polysilicon layer, which will be replaced with metal layers utilizing a replacement metal gate (RMG) process this is not limited thereto. As shown in FIG. 10, a buffer layer 262, a gate dielectric layer 264, a barrier layer 266, a silicon seed layer 272, a silicon layer 274, a silicon seed layer 272, a silicon layer 274 and a cap layer 136 are sequentially stacked on a substrate 110 in this embodiment, instead of the dielectric layer 132, the electrode layer 134 and the cap layer 136 of the aforesaid embodiment. The cap layer 136, the silicon layers 274 and the silicon seed layers 272 will then be removed and replaced by metal layers to form a metal gate in later processes. The materials of the buffer layer 262, the gate dielectric layer 264, the barrier layer 266, the silicon seed layers 272 and the silicon layers 274 are similar to the aforesaid embodiment, and thus are not described again.

To summarize, the present invention provides a gate and a gate forming process, which sequentially stacks at least one silicon seed layer and at least one silicon layer directly on a barrier layer to trap oxygen atoms in the barrier layer at an interface of the silicon seed layer and the silicon layer. It is noted that the silicon seed layer and the silicon layer must be formed by different precursors to form the interface between the two layers. For instance, even if the silicon seed layer and the silicon layer are formed by precursors such as silane, there must be at least one different precursor. The silicon layer may be an amorphous silicon layer which will have more dangling bonds therein and trap more oxygen atoms. As more oxygen atoms are trapped by the silicon seed layer and the silicon layer, less oxygen atoms will diffuse toward a gate dielectric layer and a buffer layer below the barrier layer.

In a preferred embodiment, the silicon seed layer and the silicon layer are repeatedly formed resulting in an alternately stacking of the plurality of silicon seed layers and the silicon layers. Thereby, interfaces of the silicon seed layers and the silicon layers have more silicon dangling bonds which can trap more oxygen atoms from the barrier layer. This improves processing yields and reliability.

An annealing process may be performed immediately after all of the silicon seed layers and silicon layers are stacked. As the silicon seed layers and the silicon layers are directly formed on the barrier layer, oxygen atoms from the barrier layer will move toward the silicon seed layers and the silicon layers. As the annealing process is performed, ingredients in the barrier layer and the silicon seed layers and the silicon layers can react with each other, such that titanium silicon dioxide ($TiSiO_2$) and titanium oxynitride (TiON) may be composited in the silicon seed layers and the silicon layers by oxygen, nitrogen and titanium from the barrier layer and silicon from the silicon seed layers and the silicon layers.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A gate forming process, comprising:
   forming a gate dielectric layer on a substrate;
   forming a barrier layer on the gate dielectric layer;
   sequentially forming a silicon seed layer and a silicon layer directly on the barrier layer, wherein the silicon seed layer and the silicon layer are formed in-situ, the precursors of the silicon seed layer and the silicon layer both comprise silane, and the silicon seed layer and the silicon layer are formed repeatedly, thereby a plurality of interfaces being formed; and
   removing the silicon layer and the silicon seed layer after the silicon seed layer and the silicon layer are formed.

2. The gate forming process according to claim 1, wherein the gate dielectric layer comprises a dielectric layer having a high dielectric constant and a buffer layer between the dielectric layer having the high dielectric constant and the substrate.

3. The gate forming process according to claim 1, wherein the barrier layer comprises a titanium nitride layer.

4. The gate forming process according to claim 1, wherein the silicon seed layer and the silicon layer are formed by a chemical vapor deposition process or an atomic layer deposition process.

5. The gate forming process according to claim 1, wherein the silicon seed layer and the silicon layer are formed by a chemical vapor deposition process, and a processing temperature of the chemical vapor deposition process is 360° C. - 420° C.

6. The gate forming process according to claim 5, wherein the processing temperature of the chemical vapor deposition process is 380° C.

7. The gate forming process according to claim 1, further comprising:
   performing an annealing process after the silicon seed layer and the silicon layer are formed.

8. The gate forming process according to claim 7, wherein the annealing process comprises a rapid thermal processing (RTP) process.

9. The gate forming process according to claim 7, wherein an annealing temperature of the annealing process is 900° C. -1200° C.

10. The gate forming process according to claim 9, wherein the annealing temperature of the annealing process is 970° C.

11. The gate forming process according to claim 1, wherein the silicon layer comprises an amorphous silicon layer.

12. The gate forming process according to claim 1, further comprising:
    forming a work function metal layer on the barrier layer.

* * * * *